United States Patent
Watanbe et al.

(10) Patent No.: US 7,621,042 B2
(45) Date of Patent: Nov. 24, 2009

(54) METHOD FOR MOUNTING ELECTRONIC COMPONENTS ON A SUBSTRATE

(75) Inventors: Yasushi Watanbe, Tokyo (JP); Ikuo Hibino, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 263 days.

(21) Appl. No.: 11/179,132

(22) Filed: Jul. 11, 2005

(65) Prior Publication Data
US 2006/0037777 A1 Feb. 23, 2006

(30) Foreign Application Priority Data
Jul. 12, 2004 (JP) ............................. 2004-204639

(51) Int. Cl.
*H05K 3/30* (2006.01)
(52) U.S. Cl. ............................. 29/837; 29/830; 29/832; 257/774
(58) Field of Classification Search .................... 29/832, 29/834, 836, 837, 841, 830; 174/255, 260–262; 257/678, 680, 700, 711, 723, 774; 361/750–756
See application file for complete search history.

(56) References Cited

U.S. PATENT DOCUMENTS

| | | | | | |
|---|---|---|---|---|---|
| 4,912,844 | A | * | 4/1990 | Parker | 29/848 |
| 5,173,844 | A | * | 12/1992 | Adachi et al. | 174/255 |
| 5,241,456 | A | * | 8/1993 | Marcinkiewicz et al. | 174/260 |
| 5,422,513 | A | * | 6/1995 | Marcinkiewicz et al. | 257/711 |
| 6,333,566 | B1 | * | 12/2001 | Nakamura | 257/680 |
| 6,974,909 | B2 | * | 12/2005 | Tanaka et al. | 257/676 |

FOREIGN PATENT DOCUMENTS

JP 9-139561 A1 5/1997

* cited by examiner

*Primary Examiner*—Donghai D. Nguyen
(74) *Attorney, Agent, or Firm*—Brinks Hofer Gilson & Lione

(57) ABSTRACT

A film substrate in a mounting structure of electronic components has positioning holes capable of positioning the electronic components passing therethrough. One surface of each of the electronic components which are inserted and positioned in the positioning holes protrudes from one surface of the film substrate, and the other surfaces thereof are positioned in the positioning holes, respectively. Conductive patterns are formed on the other surface of the film substrate and are electrically connected to the other surfaces of the electronic components positioned in the positioning holes.

2 Claims, 1 Drawing Sheet

METHOD FOR MOUNTING ELECTRONIC COMPONENTS ON A SUBSTRATE

This application claims the benefit of priority to Japanese Patent Application No. 2004-204639 filed on Jul. 12, 2004, herein incorporated by reference.

BACKGROUND OF THE INVENTION

1. Field of the Invention

The present invention relates to a mounting structure of electronic components and a mounting method thereof, and more particularly, to a mounting structure of electronic components and a mounting method thereof capable of efficiently and reliably mounting electronic components on a film substrate.

2. Description of the Related Art

A conventional mounting structure and mounting method of electronic components will be described with reference to FIG. 4. A film substrate 31 made of heat-resistant resin, such as polyimide, is provided, and a positioning hole 33 into which an electronic component 32, which is a chip component, is inserted is formed in the film substrate 31 by punching.

In addition, conductive patterns 34 are formed on a lower surface of the film substrate 31, and the conductive patterns 34 have a pair of electrode pads 34a and 34b which protrudes from an inner surface of the positioning hole 33 toward the inside thereof.

Further, the electronic component 32 has a pair of terminal parts 32a and 32b to be electrically connected to the pair of electrode pads 34a and 34b, respectively, on the left and right sides thereof.

A mounting method of electronic components using the film substrate 31 and the electronic component 32 having the above-mentioned structure will be described. First, soldering paste 35 is coated on each of the pair of electrode pads 34a and 34b which protrude toward the inside of the positioning hole 33.

After that, the electronic component 32 is inserted into the positioning hole 33 of the film substrate 31, whereby the electronic component 32 is positioned in the positioning hole 33, and the terminal parts 32a and 32b come in contact with the pair of electrode pads 34a and 34b, respectively.

Then, when the pair of electrode pads 34a and 34b is partially heated or the entire film substrate 31 is passed through a high-temperature furnace, the soldering paste 35 is fused so that the pair of electrode pads 34a and 34b is electrically connected to the electronic component 32. Next, when the fused soldering paste 35 is cooled, the soldering paste 35 is solidified so that the electronic component 32 is fixed into the positioning hole 33.

The above-mentioned structure and method are described in Japanese Unexamined Patent Application Publication No. 9-139561.

However, in the above-mentioned conventional mounting structure and mounting method of electronic component, since the electrode pads 34a and 34b are heated in order to fuse the soldering paste 35, the film substrate 31 should have high heat resistance, which causes an increase in manufacturing costs.

To solve the above-mentioned problem, an inexpensive film substrate 31 not having high heat resistance can be used by using a conductive adhesive instead of the soldering paste 35. However, since the conductive adhesive is also expensive, it is difficult to decrease manufacturing costs.

SUMMARY OF THE INVENTION

The invention has been made to solve the above-mentioned problem, and it is an object of the invention to provide a mounting structure of electronic components and a mounting method thereof capable of reliably positioning and mounting electronic components on a film substrate, and of mounting electronic components on a film substrate at the same time when conductive patterns are formed on the film substrate by printing, thereby decreasing manufacturing costs.

According to a first aspect of the invention to solve the above-mentioned problem, a mounting structure of electronic components includes a film substrate; electronic components mounted on the film substrate; and conductive patterns that are electrically connected to the electronic components. In the mounting structure, the film substrate has positioning holes capable of positioning the electronic components passing therethrough, and one surface of each of the electronic components inserted and positioned in the positioning holes protrudes from one surface of the film substrate, and the other surfaces thereof are positioned in the positioning holes, respectively. In addition, the conductive patterns are formed on the other surface of the film substrate, and are electrically connected to the other surfaces of the electronic components positioned in the positioning holes.

Further, according to a second aspect of the invention, in the above-mentioned structure, it is preferable that the electronic components have terminal parts to be electrically connected to the conductive patterns, and that the terminal parts on the other surfaces of the electronic components which are inserted into the positioning holes be flush with the other surface of the film substrate, so that the conductive patterns are connected to the terminal parts.

Furthermore, according to a third aspect of the invention, in the above-mentioned structure, it is preferable that predetermined clearances be formed between the electronic components and the positioning holes, and that the electronic components be fixed on the substrate by the conductive patterns which have flowed into the clearances.

Moreover, according to a fourth aspect of the invention, it is preferable that the above-mentioned mounting structure of electronic components further include a protective film for covering the other surface of the film substrate having the conductive patterns thereon and the other surfaces of the electronic components connected to the conductive patterns.

In addition, according to a fifth aspect of the invention, a mounting method of electronic components includes: in the mounting structure of electronic components according to the first to third aspects, inserting the other surfaces of the electronic components into the positioning holes of the film substrate; forming the conductive patterns on the other surface of the film substrate by performing a screen printing method using a conductive ink; and connecting the conductive patterns to the terminal parts on the other surfaces of the electronic components.

Further, according to a sixth aspect of the invention, preferably, the above-mentioned method further includes mounting the electronic components on a positioning jig so that one surface of each of the electronic components faces the positioning jig; covering the positioning jig with the film substrate from the side of the other surfaces of the electronic components such that the electronic components are inserted into the positioning holes, respectively; and positioning the other surfaces of the electronic components in the positioning holes, so that the terminal parts formed on the other surfaces of the electronic components are flush with the other surface of the film substrate.

Further, according to a seventh aspect of the invention, in the above-mentioned method, preferably, when the conductive patterns are formed by performing the screen printing method using the conductive ink, the conductive ink is flown into the clearances, and is then hardened so as to fix the electronic components on the film substrate.

Moreover, according to an eighth aspect of the invention, in the above-mentioned method, it is preferable that the positioning holes be formed by punching the film substrate using a press machine.

DESCRIPTION OF THE PREFERRED EMBODIMENT

Figure 1:
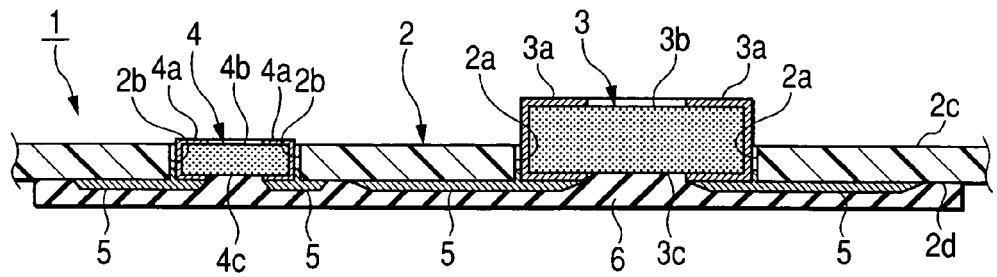
FIG. 1 is a cross-sectional view illustrating a mounting structure of electronic components according to the invention.
Figure 2:
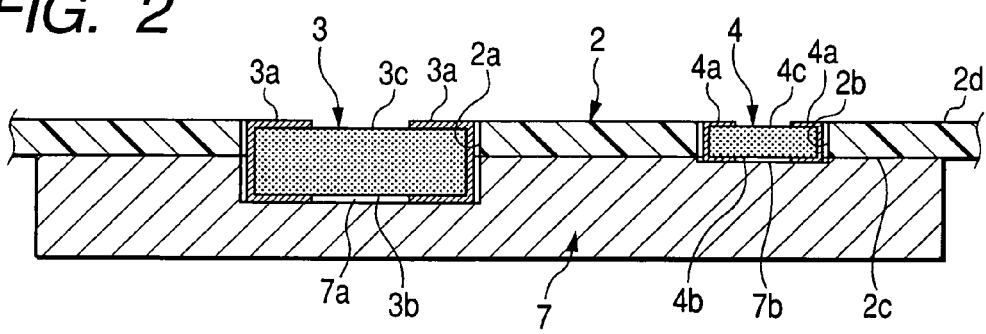
FIG. 2 is a cross-sectional view illustrating a mounting method of electronic components according to the invention.
Figure 3:
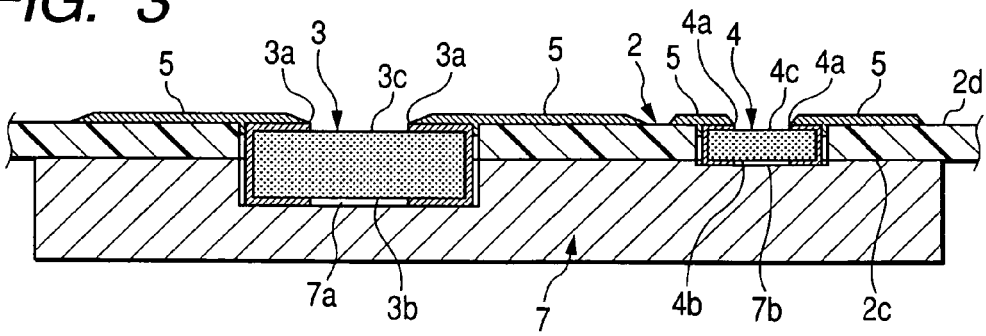
FIG. 3 is a cross-sectional view illustrating the mounting method of electronic components according to the invention.
Figure 4:
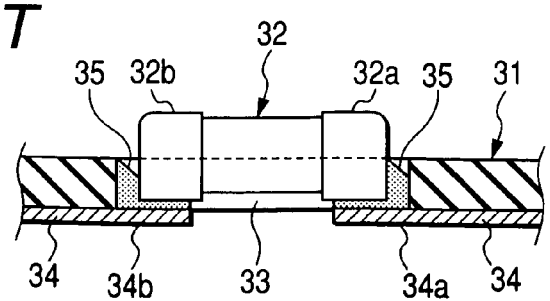
FIG. 4 is a cross-sectional view illustrating a conventional mounting structure of an electronic component.

Hereinafter, a mounting structure of electronic components and a mounting method thereof according to an embodiment of the invention will be described with reference to FIGS. 1 to 3. FIG. 1 is a cross-sectional view illustrating a mounting structure of electronics component according to the invention, and FIGS. 2 and 3 are cross-sectional views illustrating a mounting method of electronic components according to the invention.

First, the mounting structure of electronic components according to the invention will be described with reference to FIG. 1. A flexible film substrate 2 having a predetermined thickness is arranged.

The film substrate 2 is made of, for example, polyethylene terephthalate, which is a material obtainable from the market, and has first and second positioning holes 2a and 2b punched by, for example, a press machine therein, in order to insert and position first and second electronic components 3 and 4, which are described below.

The first electronic component 3 composed of a chip component, such as a chip resistor or a chip semiconductor, is inserted into the first positioning hole 2a, and the second electronic component 4 composed of a small chip component, which is thinner than the first electronic component 3, is inserted into the second positioning hole 2b.

The first and second electronic components 3 and 4 have terminal parts 3a and 4a made of metal sheets on the left and right sides thereof, respectively, as shown in FIG. 1.

In addition, the first and second electronic components 3 and 4 are inserted into and positioned by the first and second positioning holes 2a and 2b so that surfaces 3b and 4b thereof, which are upper surfaces, protrude from one surface of the film substrate 2, which is an upper surface, as shown in FIG. 1, and the other surfaces 3c and 4c thereof, which are lower surfaces, are positioned in the first and second positioning holes 2a and 2b, respectively, as shown in FIG. 1.

Further, the first and second electronic components 3 and 4 have the terminal parts 3a and 4a provided on the left and right sides thereof, respectively, as shown in FIG. 1. When the first and second electronic components 3 and 4 are inserted into the first and second positioning holes 2a and 2b so as to be positioned, the terminal parts 3a and 4a formed on the other surfaces 3c and 4c of the first and second electronic components 3 and 4 are substantially flush with the other surface 2d of the film substrate 2.

Furthermore, conductive patterns 5 are printed using a conductive ink on the other surface 2d of the film substrate 2, and the conductive patterns 5 are electrically connected to the terminal parts 3a and 4a on the other surfaces 3c and 4c of the first and second electronic component 3 and 4, respectively.

The conductive ink has high adhesion to the film substrate 2 and the terminal parts 3a and 4a, and has also high conductivity.

Moreover, predetermined clearances are formed between the first and second electronic components 3 and 4 inserted into the first and second positioning holes 2a and 2b and the inner surfaces of the first and second positioning holes 2a and 2b, respectively.

When the conductive patterns 5 are printed, the conductive ink flows into the clearances and is then hardened so as to fix the first and second electronic components 3 and 4 in the first and second positioning holes 2a and 2b, respectively.

Since the first and second electronic components 3 and 4 are fixed on the film substrate 2 in this manner, an adhesive that is difficult to treat is not needed, and it is possible to improve the efficiency of mounting the first and second electronic components 3 and 4 on the film substrate 2.

In addition, the other surface 2d of the film substrate 2 having the conductive patterns 5 thereon and the other surfaces 3c and 4c of the first and second electronic components 3 and 4 connected with the conductive patterns 5 are covered with a protective film 6 made of an insulating resist film or the like, in order to be protected.

Since the protective film 6 prevents, for example, dust from being attached on the conductive patterns 5 or the first and second electronic components 3 and 4, an electrical failure is prevented from occurring in the conductive patterns 5 or the first and second electronic components 3 and 4.

In the mounting structure 1 of electronic components according to the invention, it is possible to mount a plurality of first and second electronic components 3 and 4 on the film substrate 2 at the same time during the printing of the conductive patterns 5 on the film substrate 2 by inserting the plurality of first and second electronic components 3 and 4 into a plurality of the first and second positioning holes 2a and 2b formed in the film substrate 2. Therefore, it is possible to further improve efficiency of mounting the electronic components.

Furthermore, when the conductive patterns 5 are printed, it is possible to mount the first and second electronic components 3 and 4 on the film substrate 2. Accordingly, a high temperature for soldering is not applied to the film substrate 2.

For this reason, the film substrate 2 does not need to have heat resistance and the like, and it is possible to use an inexpensive film substrate 2, which is obtainable from the market. Therefore, it is possible to reduce manufacturing costs of the mounting structure 1 of electronic components according to the invention.

Moreover, a mounting method of electronic components according to the invention will be described with reference to FIGS. 2 and 3. First, the film substrate 2 which has the first and second positioning holes 2a and 2b punched by, for example, a press machine, and a positioning jig 7 which has first and second positioning portions 7a and 7b capable of positioning the first and second electronic components 3 and 4 therein are prepared in advance.

When the first and second electronic components 3 and 4 are respectively positioned by the first and second positioning portions 7a and 7b of the positioning jig 7, in the first and second electronic components 3 and 4, the terminal parts 3a and 4a on the other surfaces 3c and 4c, which protrude upward from the positioning jig 7, have the same height. Accordingly, the terminal parts 3a and 4a are substantially flush with each other on the side of the other surfaces 3c and 4c of the first and second electronic components 3 and 4.

After that, the film substrate 2 covers the positioning jig 7 from the side of the other surfaces 3c and 4c of the first and second electronic components 3 and 4, so that the first and second electronic components 3 and 4 are inserted into the first and second positioning holes 2a and 2b, respectively. In this case, the other surfaces 3c and 4c of the first and second electronic components 3 and 4 are positioned in the first and second positioning holes 2a and 2b, and the terminal parts 3a and 4a formed on the other surfaces 3c and 4c thereof are substantially flush with the other surface 2d of the film substrate 2.

Then, the positioning jig 7 having the first and second electronic components 3 and 4 respectively positioned in the first and second positioning portions 7a and 7b is mounted on a base of a printing device (not shown).

Next, the conductive patterns 5 are formed on the other surface 2d of the film substrate 2 by performing a screen printing method using the conductive ink, and are elongatedly formed on the terminal parts 3a and 4a on the other surfaces 3c and 4c of the first and second electronic components 3 and 4.

In this manner, the conductive patterns 5 are electrically connected to the terminal parts 3a and 4a on the other surfaces 3c and 4c of the first and second electronic components 3 and 4, respectively.

As described above, the film substrate according to the mounting structure of electronic components of the invention has positioning holes capable of positioning the electronic components passing therethrough. Further, one surface of each of the electronic components which are inserted and positioned in the positioning holes protrudes from one surface of the film substrate, and the other surfaces thereof are positioned in the positioning holes, respectively. Furthermore, the conductive patterns are formed on the other surface of the film substrate and are electrically connected to the other surfaces of the electronic components positioned in the positioning holes, respectively. Therefore, it is possible to mount the electronic components on the film substrate and to provide an efficient mounting structure of electronic components by printing the conductive patterns.

In addition, the terminal parts on the other surfaces of the electronic components which are inserted into the positioning holes are flush with the other surface of the film substrate, so that the conductive patterns are connected to the terminal parts. Therefore, it is possible to reliably mount the electronic components on the film substrate with the printed conductive patterns.

Further, predetermined clearances are formed between the electronic components and the positioning holes, and the electronic components are fixed on the film substrate by the conductive patterns that has flowed into the clearances. Therefore, it is possible to fix the electronic components on the film substrate and to provide a mounting structure of electronic components having a high degree of mounting efficiency, by printing the conductive patterns.

Furthermore, the above-mentioned mounting structure of electronic components further includes a protective film for covering the other surface of the film substrate having the conductive patterns thereon and the other surfaces of the electronic components connected to the conductive patterns. Therefore, it is possible to prevent dust or the like from being attached on the conductive patterns or the other surfaces of the electronic components, and to prevent an electrical failure due to the attachment of dust.

Further, a mounting method of electronic components according to the invention includes: in the above-mentioned mounting structure of electronic components, inserting the other surfaces of the electronic components into the positioning holes of the film substrate; forming the conductive patterns on the other surface of the film substrate by performing a screen printing method using a conductive ink; and connecting the conductive patterns to the terminal parts on the other surfaces of the electronic components. Therefore, it is possible to mount the electronic components on the film substrate at the same time when the conductive patterns are on the film substrate by printing, and thus to provide a mounting method of electronic components having a high degree of mounting efficiency.

Moreover, the above-mentioned mounting method further includes: mounting the electronic components on a positioning jig so that one surface of each of the electronic components faces the positioning jig; covering the positioning jig with the film substrate from the side of the other surfaces of the electronic components such that the electronic components are inserted into the positioning holes, respectively; and positioning the other surfaces of the electronic components in the positioning holes, so that the terminal parts formed on the other surfaces of the electronic components are flush with the other surface of the film substrate. Therefore, it is possible to electrically connect the other surface of the film substrate to the other surfaces of the electronic components by the conductive patterns for sure.

Further, when the conductive patterns are formed by a screen printing method using the conductive ink, the conductive ink is flown into the clearances and is then hardened so as to fix the electronic components on the film substrate. Therefore, it is possible to fix the electronic components on the film substrate at the same time when the conductive patterns are formed on the film substrate by printing, and thus to improve the efficiency of mounting.

Furthermore, since the positioning holes are formed by punching the film substrate using a press machine, it is possible to easily manufacture the film substrate.

The invention claimed is:

1. A mounting method of mounting electronic components on a film substrate containing positioning holes, the method comprising:

forming the positioning holes for inserting and positioning electronic components having different thickness in the film substrate, the positioning holes being formed by punching the film substrate using a press machine;

providing a positioning jig having concave portions for inserting the electronic components having respective thicknesses thicker than that of the film substrate, in which depths of the concave portions are configured such that, when the electronic components are inserted in the concave portions to be positioned, other surfaces of the electronic components having terminal parts formed thereon are flush with an other surface of the film substrate;

covering the positioning jig with the film substrate such that the positioning holes correspond to the concave portions of the positioning jig;

inserting the electronic components into the positioning holes of the film substrate and further into the concave portions of the positioning jig such that one surface of each of the electronic components inserted in the positioning holes protrudes from one surface of the film substrate and the other surfaces of the electronic components are flush with the other surface of the film substrate; and printing conductive ink on the other surfaces of the electronic components and the film substrate to electrically connect the terminal parts of the electronic components with the film substrate by the conductive ink, and at the same time, the conductive ink flowing into clearances between the electronic components and the plurality of positioning holes to fix the electronic components to the film substrate.

2. The mounting method of electronic components according to claim 1 further comprising including a protective film which covers the other surface of the film substrate having the printed conductive ink thereon and the other surfaces of the electronic components connected to the printed conductive ink.

* * * * *

UNITED STATES PATENT AND TRADEMARK OFFICE
CERTIFICATE OF CORRECTION

PATENT NO. : 7,621,042 B2　　　　　　　　　　　　　　　　　　　　　　　　　Page 1 of 1
APPLICATION NO. : 11/179132
DATED : November 24, 2009
INVENTOR(S) : Watanbe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 562 days.

Signed and Sealed this

Twenty-sixth Day of October, 2010

David J. Kappos
*Director of the United States Patent and Trademark Office*